(12) United States Patent
Phan et al.

(10) Patent No.: US 11,217,613 B2
(45) Date of Patent: Jan. 4, 2022

(54) IMAGE SENSOR WITH SPLIT PIXEL STRUCTURE AND METHOD OF MANUFACTURING THEREOF

(71) Applicant: OmniVision Technologies, Inc., Santa Clara, CA (US)

(72) Inventors: Bill Phan, San Jose, CA (US); Yuanliang Liu, San Jose, CA (US); Duli Mao, Sunnyvale, CA (US); Seong Yeol Mun, Santa Clara, CA (US); Alireza Bonakdar, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 29 days.

(21) Appl. No.: 16/687,660

(22) Filed: Nov. 18, 2019

(65) Prior Publication Data
US 2021/0151482 A1    May 20, 2021

(51) Int. Cl.
*H01L 27/146* (2006.01)
*H04N 5/378* (2011.01)

(52) U.S. Cl.
CPC .... *H01L 27/14605* (2013.01); *H01L 27/1463* (2013.01); *H01L 27/14621* (2013.01); *H01L 27/14627* (2013.01); *H01L 27/14629* (2013.01); *H01L 27/14643* (2013.01); *H04N 5/378* (2013.01)

(58) Field of Classification Search
CPC ......... H01L 27/14605; H01L 27/14621; H01L 27/14627; H01L 27/1463; H01L 27/14643; H01L 27/14607; H01L 27/14629
See application file for complete search history.

(56) References Cited

U.S. PATENT DOCUMENTS

| 2005/0045928 | A1* | 3/2005 | Kuriyama | H01L 27/14629 257/294 |
| 2006/0197169 | A1* | 9/2006 | Cole | H01L 27/14683 257/431 |
| 2007/0210345 | A1* | 9/2007 | Oda | H01L 27/14627 257/232 |
| 2015/0333099 | A1 | 11/2015 | Lyu et al. | |
| 2016/0372507 | A1* | 12/2016 | Yang | H04N 5/374 |
| 2018/0308883 | A1* | 10/2018 | Yanagita | H04N 5/35563 |
| 2018/0366513 | A1 | 12/2018 | Yang et al. | |

* cited by examiner

*Primary Examiner* — Feifei Yeung Lopez
(74) *Attorney, Agent, or Firm* — Christensen O'Connor Johnson Kindness PLLC

(57) ABSTRACT

An image sensor includes a substrate material. The substrate material includes a plurality of photodiodes disposed therein. The plurality of photodiodes includes a plurality of small photodiodes (SPDs) and a plurality of large photodiodes (LPDs) larger than the SPDs. An array of color filters is disposed over the substrate material. A buffer layer is disposed between the substrate material and the array of color filters. A metal pattern is disposed between the color filters in the array of color filters, and between the array of color filters and the buffer layer. An attenuation layer is disposed between the substrate material and the array of color filters. The attenuation layer is above and aligned with the plurality of SPDs and a portion of each of the plurality of LPDs. An edge of the attenuation layer is over one of the plurality of LPDs.

26 Claims, 14 Drawing Sheets

IMAGE SENSOR WITH SPLIT PIXEL STRUCTURE AND METHOD OF MANUFACTURING THEREOF

BACKGROUND INFORMATION

Field of the Disclosure

This disclosure relates generally to image sensors, in particular to image sensors with split pixel structures.

Background

Image sensors may be used in various devices including cameras, sensors, and consumer electronics. Image sensors with split pixel structures have photodiodes of different sizes. The different sized photodiodes may be utilized in different applications.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1A:
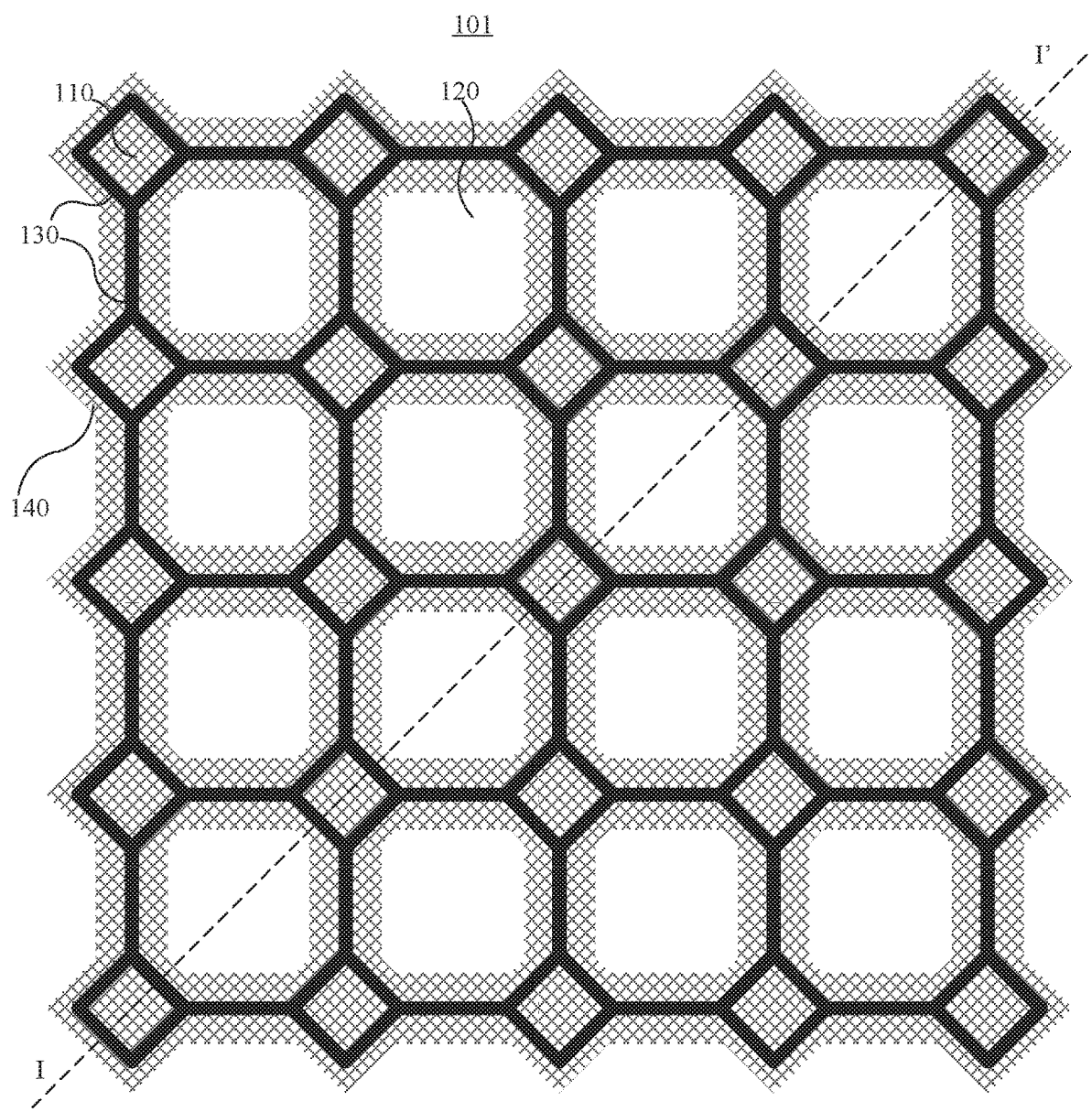
FIGS. 1A-B illustrate example image sensors in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples directed to image sensors and devices, and methods for fabricating image sensors are disclosed herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it can be the only layer between the two layers, or one or more intervening layers may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Image sensors for color images may include color filters and microlenses to focus incident light. There may be a buffer layer between a substrate including photodiodes and the color filters. The image sensor may include large photodiodes for lower intensity light sensing, and small photodiodes for higher intensity light sensing to realize high dynamic range (HDR) sensing. The large photodiodes may be arranged next to and surrounds the small photodiodes. A large photodiode may have a full well capacity that is greater than a full well capacity of a small photodiode. An attenuation layer may be disposed above and aligned with the small photodiodes. The attenuation layer may block a portion of incident light focused by the microlenses on the small photodiodes such that the small photodiodes is not saturated by the high intensity light during an integration period of image sensor since only a portion of the high intensity light will penetrate through the attenuation layer. Thus, the sensitivity of the small photodiodes to high intensity light may be improved by the attenuation layer blocking a portion of the high intensity light.

However, high angle light (caused by internal reflections due to high intensity light or other causes) may pass through the buffer layer and substrate and absorbed by the small photodiodes or even saturate the small photodiodes. This can cause deleterious effects on a sensing ability of the image sensor for high intensity light. In order to reduce the amount of high angle light entering the small photodiodes from the proximate large photodiodes, the attenuation layer may be extended to be aligned above a portion of the proximate large photodiodes.

As will be discussed, example image sensors disclosed herein have an architecture that improves performance of high intensity light sensing in image sensors. In one example, an attenuation layer is above and aligned with small photodiodes and extends over a portion of proximate large photodiodes. This prevents high angle light from deleteriously activating the small photodiodes. These advantages are especially useful in split pixel structures such as large photodiode/small photodiode (LPD/SPD) image sensors but is also applicable to other pixel structures.

Figure 1B:
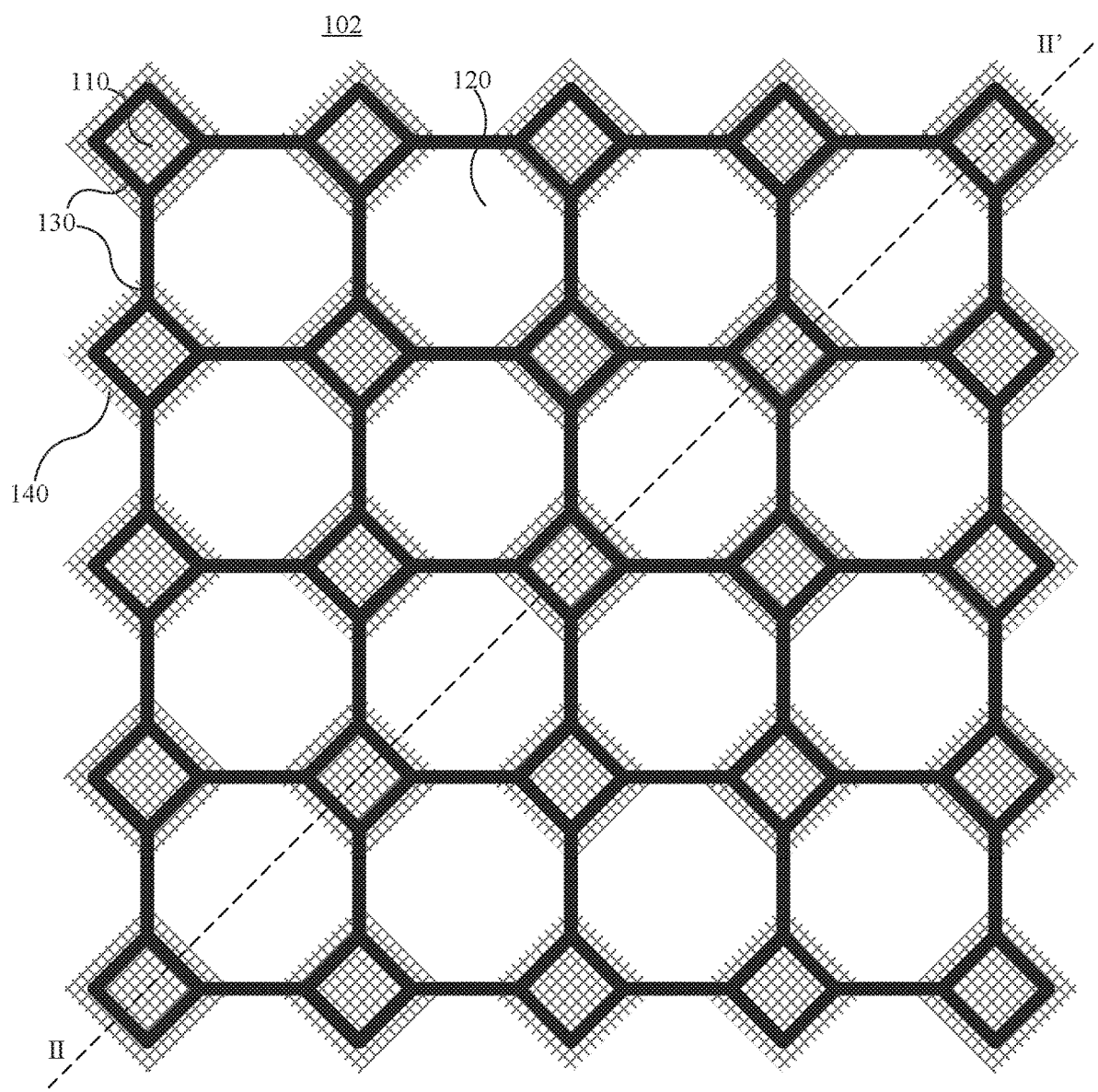

FIGS. 1A-B illustrate example image sensors in accordance with the teachings of the present invention. FIG. 1A shows an example image sensor 101 in accordance with the teachings of the present invention. The image sensor 101 has an LPD/SPD layout. The large photodiodes are in the large pixels 120 and are laid out in a grid. The small photodiodes are in the small pixels 110 disposed between and around the large pixels 120. In on example, the small pixels 110 may be square and oriented 45 degrees from the orientation of the grid of large pixels 120. Both the small pixels 110 and the large pixels 120 may be surrounded by a metal grid form of a plurality of metal patterns 130. The metal patterns 130 improves the isolation of the small photodiodes and the large photodiodes by reflecting or absorbing incident light having high angle light. The image sensor 101 also includes an attenuation layer 140 extending over the small pixels 110 and extends partially from the plurality of metal patterns 130 over the large pixels 120 proximate to the small pixels 110. In the depicted example, the grid of large pixels 120 is illustrated as being 4×4, however the grid may have any size. The concepts described herein may apply to other photodiode layouts and pixel architectures.

FIG. 1B shows another example image sensor 102 in accordance with the teaching of the present invention. image sensor 102 is similar to the image sensor 101. Image sensor 102 differs from image sensor 101 in that in image sensor 102, the attenuation layer 140 extends over the large pixels 120 only from portions of the plurality of metal patterns 130 between the large pixels 120 and the small pixels 110 and not from portions of the plurality of metal patterns 130 between two large pixels 120.

FIGS. 2A-D illustrate an example cross section views of the image sensors in accordance with the teachings of the present invention. FIGS. 2A-D may illustrate a cross section view of either image sensor 101 or image sensor 102 along the lines I-I' or respectively.

Figure 2A:
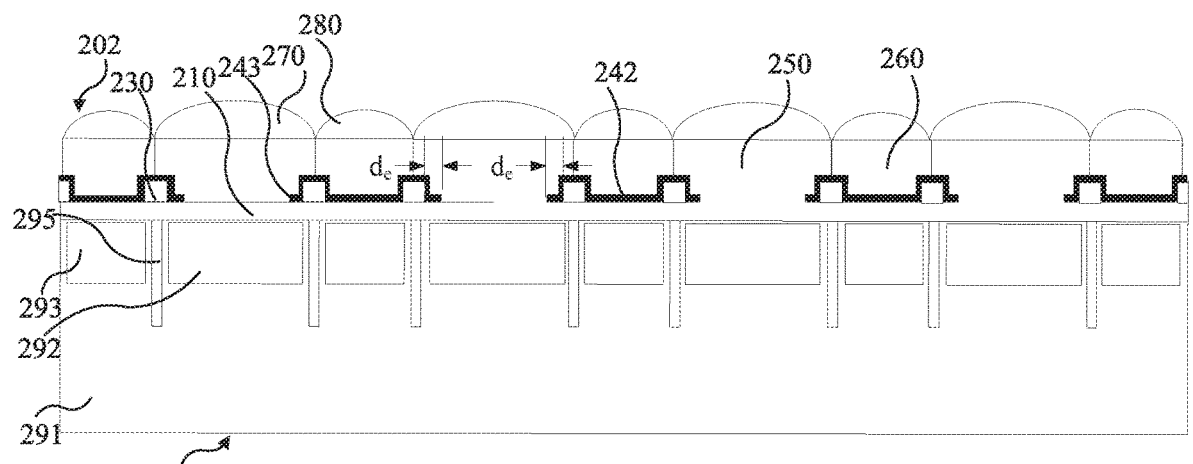
FIGS. 2A-D illustrate an example cross section views of the image sensors in accordance with the teachings of the present invention.

FIG. 2A illustrates a device including a substrate material 291 with small photodiodes 293, large photodiodes 292, and a plurality of pixel isolator 295. The device further includes a buffer layer 210, a plurality of metal patterns 230, color filters 250, 260, and microlenses 270, 280. The device also includes an attenuation layer 242 for attenuating the light sensitivity of small photodiode 293. Substrate material 291 has a backside 202 and a front side 204 opposite to the backside 202. In embodiments, the device may receive incident light through the backside 202 of substrate material 291. In one embodiment, the backside 202 may be referred as an illuminated side of image sensor 101, and the front side 204 may be referred as a non-illuminated side of image sensor 101. A large photodiode 292 may be configured to have a full well capacity that is greater than a full well capacity of a small photodiode 293 i.e., the large photodiode 292 may store more photo-generated charges than small photodiode 293. In one embodiment, large photodiode 292 may have a pixel size that is at least twice of the pixel size of small photodiode 293. Alternatively, the large photodiode 292 has a larger light exposure area than the light exposure area of neighboring small photodiode 293. In embodiments, small photodiode 293 may be arranged to be surrounded by two or more large photodiodes 292.

In the illustrated example, the large photodiode 292 with higher sensitivity incident light may be utilized for lower light intensity sensing. The small photodiode 293 on the other hand has less light exposure area less sensitive to high intensity light compare to the large photodiode 292, and therefore may be utilized for higher light intensity sensing. By including array of large photodiodes 292 and small photodiode 293 in image sensor 101, 102, a high dynamic range (HDR) imaging sensing can be realized.

The pixel isolator 295 is formed on the backside 202 of substrate material 291 and arranged to extend down (relative to the illustration, the device may be oriented in any direction) from a backside surface of the backside 202 into the substrate material 291. The substrate material 291 may be a semiconductor substrate, such as silicon substrate, a doped silicon substrate, such as n-type doped silicon substrate or p-type doped substrate, a silicon on insulator substrate, or any suitable substrate material. The large and small photodiodes 292, 293 may be formed in the substrate material 291, for example by ion implantation on the front side 204 of the substrate material 291. In some embodiments, photodiodes 292, 293 may be n-type photodiodes formed in a P-type silicon substrate material. However, in other embodiments, the polarity may be reversed, for example, photodiodes 292, 293 may be p-type photodiodes formed in the n-type silicon substrate material. The pixel isolator 295 may include electrically insulating materials such as polymer or oxide. The pixel isolator 295 may be formed between the adjacent photodiodes 292, 293 to prevent electrical and/or optical crosstalk between adjacent photodiodes 292, 293.

In one embodiment, each of pixel isolators 295 is a deep trench isolation (DTI) structure filled with dielectric material (such as silicon oxide), reflective metal material, or a combination thereof.

Each metal pattern 230 may be formed above and aligned with the corresponding pixel isolator 295. Restated, each of the plurality of metal patterns 230 may be formed above and between the photodiodes 292, 293. Each of the plurality of metal patterns 230 may be formed between the color filters 250, 260. The color filters 250, 260 may include large color filters 250 and small color filters 260. The large color filters 250 may be above and aligned with the large photodiodes 292. The small color filters 260 may be above and aligned with the small photodiodes 293. An array of microlenses may include microlens 270 and microlens 280. Each of the microlenses 270, 280 may be formed above and aligned with one of the color filters 250, 260, respectively. Restated, each of the microlenses 270, 280 may be formed above and aligned with one of the photodiode 292, 293 and operate to direct and focus light incident on the light receiving side (for example, backside 202) substrate material 291 onto the respective photodiode 292, 293 through corresponding color filters 250, 260. For example, microlens 270 may be form above the large photodiode 292 with each edge aligned to the center of the respect metal pattern 230 on each side and direct incident light onto the light exposure area of the large photodiode 292. Microlens 280 may be form above the small photodiode 293 with each edge aligned to the center of the respect metal pattern 230 on each side and direct incident light onto the light exposure area of the small photodiode 293.

In some embodiments, a first height of microlens 270, i.e., a distance between the top of microlens 270 and the respective color filter 250 may be different from a second height of microlens 280, i.e., the distance between the top of microlens 280 and the respective color filter 260. For example, the first height of microlens 270 may be greater than the second height of microlens 280, i.e., microlens 270 is taller than the microlens 280, to compensate curvature differences between microlens 270 and microlens 280, i.e. microlens 270 is taller than the microlens 280, to compensate curvature differences between microlens 270 and microlens 280 such that microlens 270 and microlens 280 have substantially the same focal length.

The buffer layer 210 is formed on and above the backside 202 of the substrate material 291. The buffer layer 210 may include an oxide material such as silicon dioxide. The buffer layer 210 may serve as buffer layer to provide process margin for etching and chemical mechanical polishing processes and prevent damage to substrate material 291. The plurality of metal patterns 230 may be formed on the buffer layer 210. Each of the plurality of metal patterns 230 may include a metal such as aluminum or tungsten. Optionally, a barrier and adhesion layer may be disposed between each of the plurality of metal patterns 230 and buffer layer 210 to provide adhesion between each metal patterns 230 and buffer layer 210 and prevent metal ions diffusion into substrate material 291. The barrier and adhesion layer may include formed of titanium (Ti), titanium nitride (TiN), or a combination thereof.

The attenuation layer 242 is arranged to form and align with small photodiode 293 to attenuate incident light directed to the associated small photodiode 293 for example, through absorption to reduce amount of incident light reaching the small photodiode 293, thereby preventing small photodiode 293 from saturated during integration period. The attenuation layer 242 may be formed on the buffer layer 210 and the metal pattern 230. The attenuation layer 242 may be disposed between the substrate material 291 and the color filters 250, 260. The attenuation layer 242 may be disposed between the buffer layer 210 and the color filters 250, 260. The attenuation layer 242 may be disposed between the small color filter 260 and the buffer layer 210 such that the small color filter 260 does not directly contact the buffer layer 210. The attenuation layer 242 may extend in all directions away from the small photodiodes 293 in a plane parallel to a top surface of the substrate material 291.

The attenuation layer 242 may be single layer or multilayer stack structure with thickness configured to adjust the transmittance of incident light to the small photodiodes 293. The attenuation layer 242 may be formed from titanium, titanium nitride, tantalum, aluminum, tungsten, or a combination thereof.

The attenuation layer 242 is arranged to cover the entire light exposing areas of each small photodiode 293 and at least a portion of the light exposing area of each large photodiode 292 to reduce issue of incident light with high incident angle to be received by corresponding large photodiode 292 from crosstalk over to adjacent small photodiode 293 affecting the light sensitivity of adjacent small photodiode 293. In other words, the attenuation layer 242 is arranged to have an extended portion 243 extending from an edge of a metal pattern 230 that is aligned with a pixel isolator 295 between a small photodiode 293 and adjacent large photodiode 292, a distance $d_e$ into the light exposure area of the adjacent large photodiode 292. In one embodiment, the extended distance $d_e$ of the attenuation layer 242 from an edge of a metal pattern 230 into the light exposure area of large photodiode 292 may range from 10-500 nm depending on at least a target quantum efficiency for the large photodiodes 292 (e.g., quantum efficiency of at least 0.8) for an imaging requirement and fabrication limitations e.g., photo-lithography patterning and etching capability.

Those skilled in the art should appreciate, through configuring the length of the attenuation layer 242 covering the light exposure area of the large photodiode 292, and the focal point of micro-lenses 280 corresponding to the large photodiode 292, the impact of the attenuation layer 242 to the quantum efficiency (QE) of the large photodiode 292 can be obtained.

In one embodiments, the extended distance $d_e$ of the attenuation layer 242 from an edge of a metal pattern 230 into the light exposure area of large photodiode 292 may be designed based on the following formula:

$$QE_{LPD}(d, \lambda) \cong QE_{LPD\_POR}(d = 0, \lambda) \frac{\left(1 - \exp\left(-\frac{2(p-d)^2}{w^2}\right)\right)}{\left(1 - \exp\left(-\frac{2p^2}{w^2}\right)\right)}$$

$$w = \frac{2\lambda}{\pi NA}$$

where, $QE_{LPD}$ refers to a target quantum efficiency (QE) of a large photodiode 292; $QE_{LPD\_POR}$ refers to a nominal quantum efficiency (QE) of large photodiode 292 not being covered by attenuation layer, for example greater or equal to 0.8; $\lambda$ refers to the wavelength of the incident light directed to the large photodiode 292, with respect to which the quantum efficiency is computed; d refers to the total length of light exposure area of the large photodiode 292 being covered by the attenuation layer 242, i.e., $d=2d_e$; p refers to the pixel pitch; w refers to focused beam size of corresponding microlens 270; NA refers to the numerical aperture value of corresponding microlens 270 and is related to f number of microlens which is approximately D/2f, wherein D refers to the aperture size of the microlens 270 and f refers to the focal length of microlens 270. For a typical spherical shaped microlens, such as hemisphere, NA is typically less than 0.5.

In the illustrated embodiment, the total length of light exposure area of the large photodiode 292 being covered by the attenuation layer 242 d may be determined based on $QE_{LPD}$ of 0.4 to 0.9 for incident light with a wavelength of 530 nm using the equation. The larger the total length d of attenuation layer 242 covering light exposure area of large photodiode 292 (e.g., 2 times the extended distance $d_e$), the lower the quantum efficiency of large photodiode 292 $QE_{LPD}$. Thus, it should be appreciated by those skilled in the art by having a target quantum efficiency of large photodiode 292 $QE_{LPD}$ and the corresponding microlens aperture size, the required extended length $d_e$ can be specifically designed. For example, the total length d of attenuation layer covering light exposure area of large photodiode 292 may be determined using a full wave optical simulation software such as a Lumerical™ finite difference time domain (FDTD).

Figure 2B:
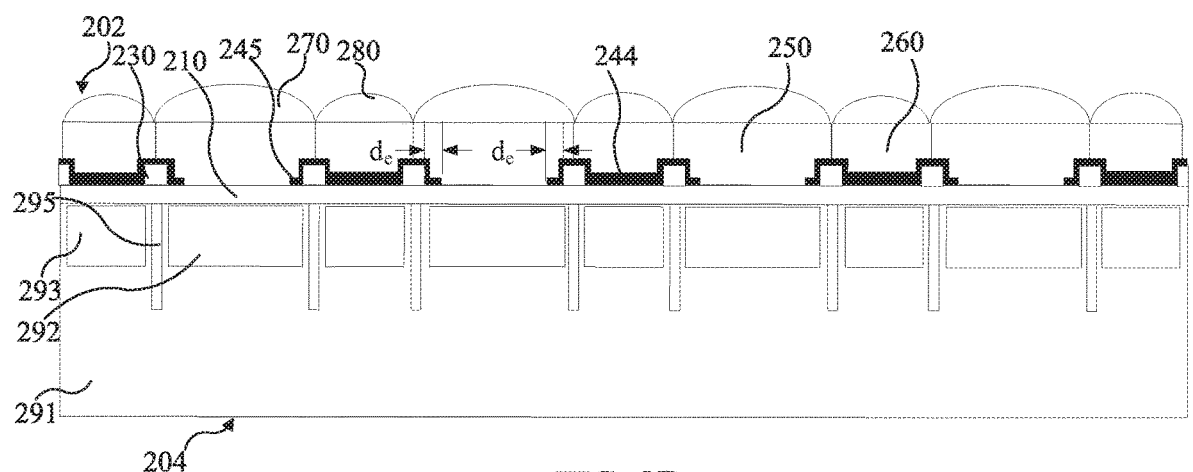

FIG. 2B illustrates a device similar to the device in FIG. 2A except that the attenuation layer 244 of FIG. 2B is thicker than attenuation layer 242 of FIG. 2A where it is above and aligned with the small photodiodes 293. As an example, (and as will be later described in further detail) the attenuation layer 244 may be twice as thick where it is above and aligned with the small photodiodes 293. The attenuation layer 244 may also have other thicknesses where it is above and aligned with the small photodiodes 293. The attenuation layer 244 may have an extending portion 245 extending from an edge of a metal pattern 230 that is aligned with a pixel isolator 295 between a small photodiode 293 and adjacent large photodiode 292 a distance $d_e$ into the light exposure area of the adjacent large photodiode 292.

Figure 2C:
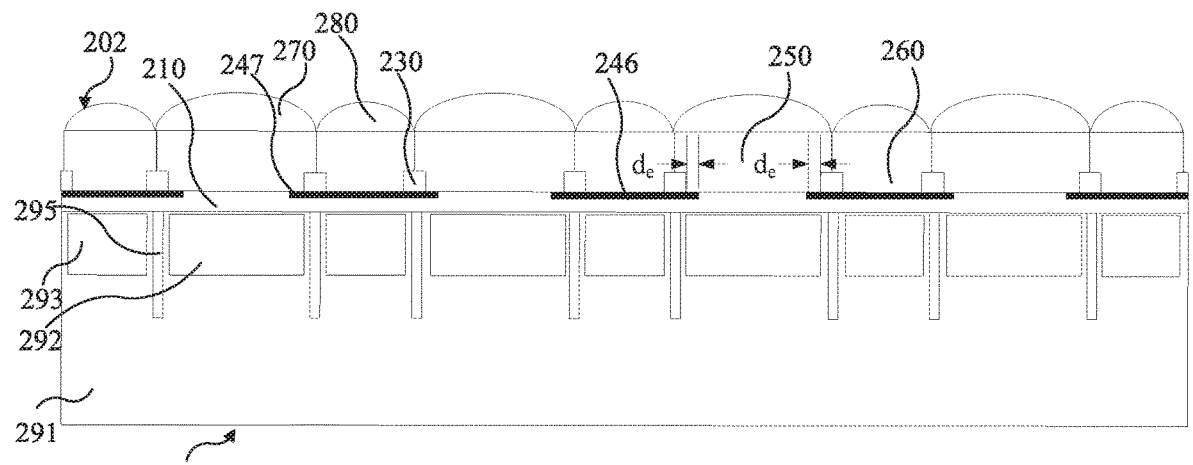

FIG. 2C illustrates a device similar to the device in FIG. 2A except that the attenuation layer 246 of FIG. 2C is disposed between the metal pattern 230 and the buffer layer 210. The metal pattern 230 may be formed on the attenuation layer 246. In one embodiment, each of metal patterns 230 is formed directly above the attenuation layer 246. Further, the attenuation layer 246 may be formed in a recess in the buffer layer 210. The attenuation layer 246 may have an extending portion 247 extending from an edge of a metal pattern 230 that is aligned with a pixel isolator 295 between a small photodiode 293 and adjacent large photodiode 292 a distance $d_e$ into the light exposure area of the adjacent large photodiode 292.

Figure 2D:
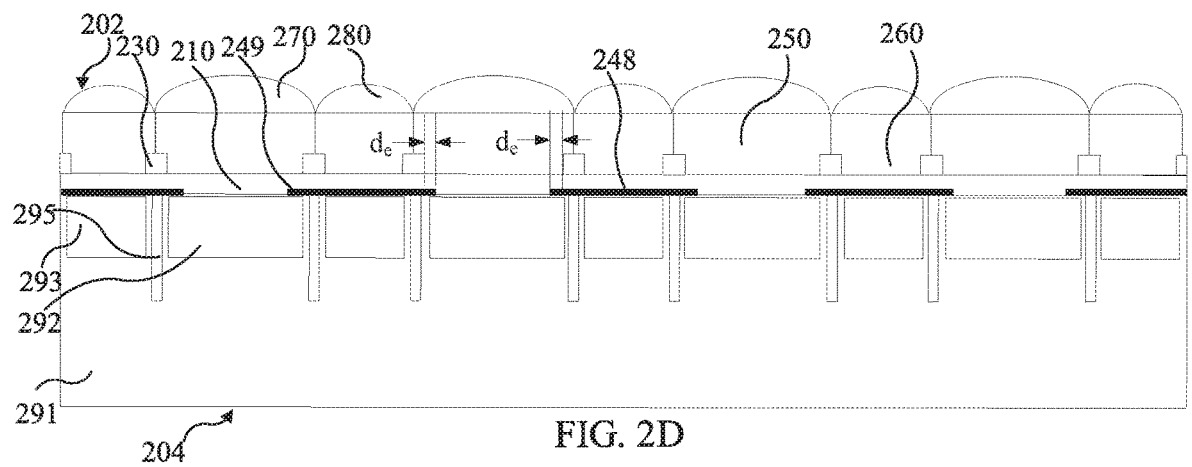

FIG. 2D illustrates a device similar to the device in FIG. 2A except that the attenuation layer 248 of FIG. 2D is disposed between the substrate material 291 and the buffer layer 210. The buffer layer 210 may be formed on the attenuation layer 248 and the attenuation layer 248 may be formed on the substrate material 291. The attenuation layer 248 may have an extending portion 249 extending from an edge of a metal pattern 230 that is aligned with a pixel isolator 295 between a small photodiode 293 and adjacent large photodiode 292 a distance $d_e$ into the light exposure area of the adjacent large photodiode 292.

Figure 3A:
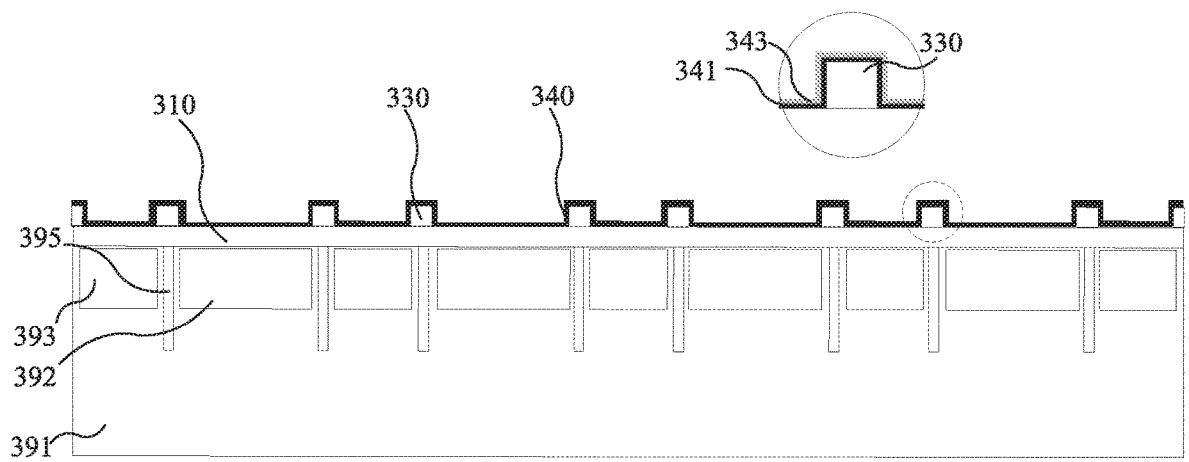
FIGS. 3A-C illustrate an example process of forming an image sensor in accordance with the teachings of the present invention.
Figure 3B:
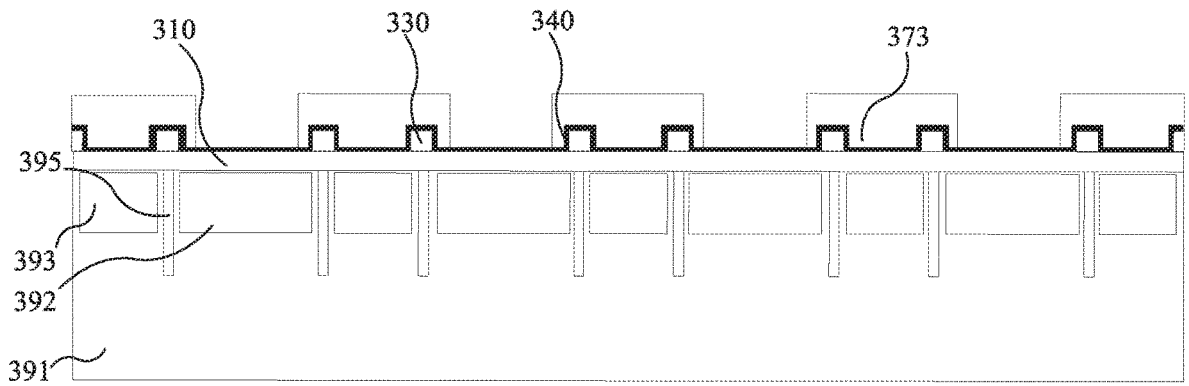
Figure 3C:
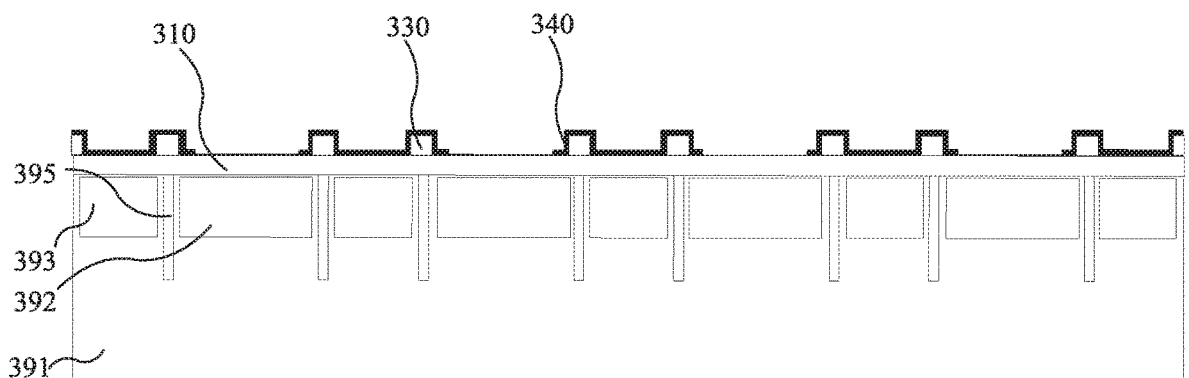

FIGS. 3A-C illustrate an example process of forming an image sensor in accordance with the teachings of the present invention. FIG. 3A illustrates a device with the attenuation layer 340 formed on buffer layer 310 and metal pattern 330. The attenuation layer 340 may be deposited using an isotropic deposition process. In some embodiments the attenuation layer 340 may include alternating stacking layers of material, wherein the stacking material may include titanium, titanium nitride, tantalum, aluminum, tungsten, or other suitable material. For example, the attenuation layer 340 may include a first layer 341 and a second layer 343. The first layer 341 may be titanium (Ti). The second layer 343 may be titanium nitride (TiN). In one embodiment, the first layer 341 of titanium may be formed on the buffer layer 310 with a first thickness by deposition process, and injecting nitrogen atom thereafter reacting with the first layer 341 of titanium to form the second layer 343 of titanium nitride. For another example, the first layer 341 may be titanium nitride and the second layer 343 may be titanium. It should be appreciated by those skilled in the art that the stacking order between titanium and titanium nitride for the attenuation layer 340 may vary depending on the processing requirements.

The first layer 341 may be about 30 nm to 100 nm thick. The second layer 343 may be about 20 nm to 80 nm thick. The thickness of the first and second layers 341, 343 may be adjusted based on the desired penetration or transmittance of incident light to the small photodiodes 393. As shown, the attenuation layer 340 may be formed as a single layer of each of the first and second layers 341, 343.

FIG. 3B illustrates the device of FIG. 3A with a mask 373 formed over and aligned with the small photodiodes 393 and extending from the metal pattern 330 over a portion of the large photodiodes 392. The mask 373 may include a photoresist material.

FIG. 3C illustrates the device of FIG. 3A with a portion of the attenuation layer 340 removed over the large photodiodes 392 and the mask also removed. The portion of the attenuation layer 340 over the large photodiodes 392 may be removed by etching away the attenuation layer 340 using the mask 373 as a mask. The mask 373 may be removed by a wet etching process. Color filters 250, 260 and microlenses 270, 280 may be formed on the device of FIG. 3C to arrive at the device of FIG. 2A.

Figure 4A:
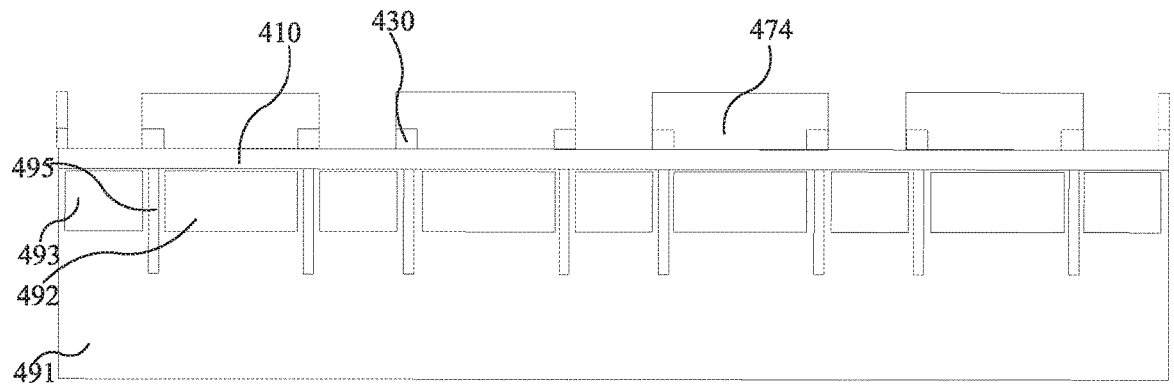
FIGS. 4A-F illustrate another example process of forming an image sensor in accordance with the teachings of the present invention.

FIGS. 4A-F illustrate an example process of forming an image sensor in accordance with the teachings of the present invention. FIG. 4A illustrates a device including a substrate material 491, a plurality of pixel isolators 495, small photodiodes 493 and large photodiodes 492. The device also includes a buffer layer 410 formed on the substrate material 491, a plurality of metal patterns 430 formed on the buffer layer 410, and a mask 474 formed on the buffer layer 410 and the plurality of metal pattern 430. The mask 474 is deposited above and aligned with the large photodiodes 492 and also covers a top surface of the plurality of metal patterns 430. The mask 474 may be made of a photoresist material or other material which can be removed by a wet etching process which is etch selective with the plurality of metal patterns 430 and buffer layer 410.

Figure 4B:
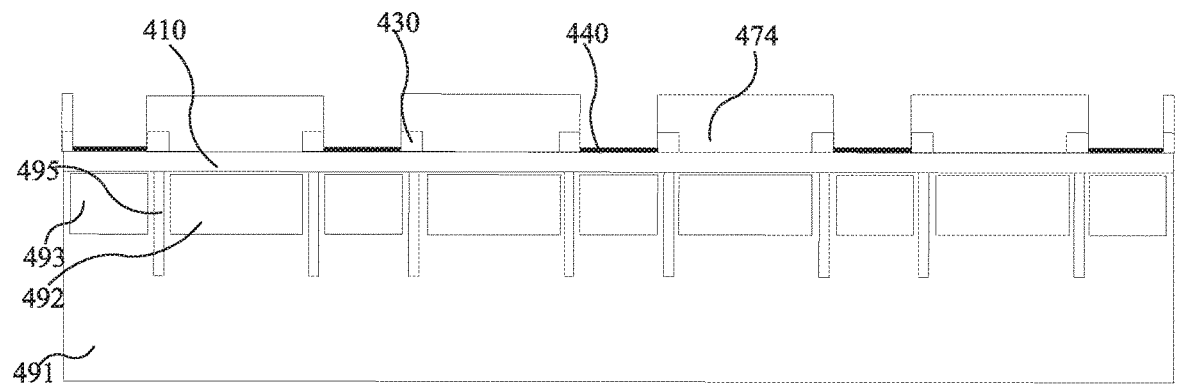

FIG. 4B illustrates the device of FIG. 4A with an attenuation layer 440 formed between the opening portions of the mask 474. The attenuation layer 440 may be deposited using an anisotropic process for example by chemical vapor deposition (CVD) process, physical vapor deposition (PVD) process or atomic layer deposition (ALD) process.

Figure 4C:
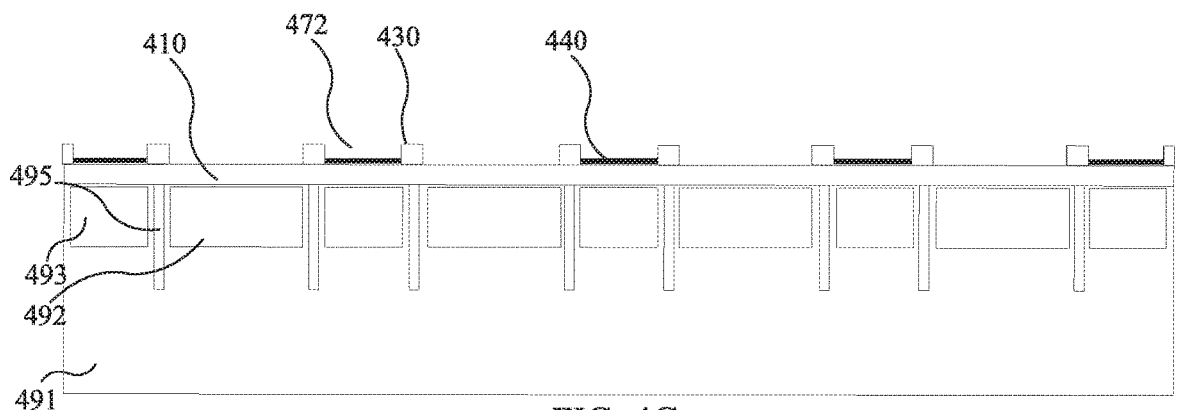

FIG. 4C illustrates the device of FIG. 4B with the mask 474 removed. The mask 474 may be removed using a wet etching process. Some material for the attenuation layer 440 may be deposited on the top surface of the mask 474 when the attenuation layer 440 is formed, this material may be removed by the wet etching as well. The wet etching process leaves an attenuation layer 440 which is above and aligned with the small photodiodes 493.

As an alternative, an attenuation layer 440 which is above and aligned with the small photodiodes 493 may be formed by depositing the material for the attenuation layer 440 over the entire surface of the device and then forming a mask to remove the material for the attenuation layer 440 which is above and aligned with the large photodiodes 492 and the plurality of metal patterns 430 and then using the mask to remove the portion of the material for the attenuation layer 440 which is above and aligned with the large photodiodes 492 and the plurality of metal patterns 430.

Figure 4D:
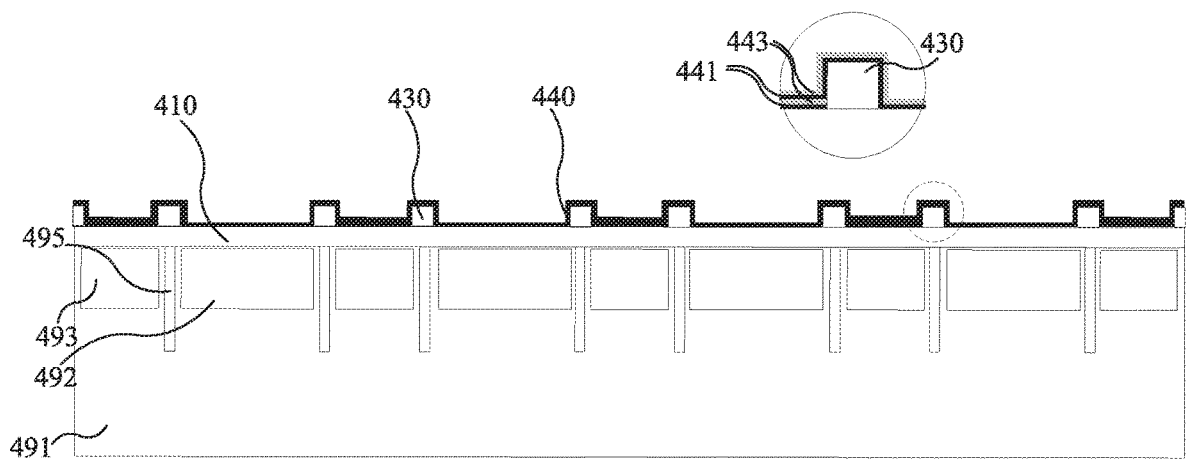

FIG. 4D illustrates the device of FIG. 4C with additional material for the attenuation layer 440 formed on the device. The additional material for the attenuation layer 440 may be deposited using an isotropic deposition process. The attenuation layer 440 may include alternating layers of material. For example, the attenuation layer 440 may include a first layer 441 and second layer 443. In one embodiment, the first layer 441 may be titanium. The second layer 443 may be titanium nitride. In another embodiments, the first layer 441 may be titanium nitride, and the second layer 443 may be titanium. The first layer 441 may be about 30 nm to 100 nm thick. The second layer 443 may be about 20 nm to 80 nm thick. The thickness of the first and second layers 441, 443 may be adjusted based on the desired penetration or transmittance of incident light to the small photodiodes 493. As shown, the additional material for the attenuation layer 440 may be formed as additional layers of the first and second layers 441, 443 on top of the first and second layers 441 and 443 previously deposited.

Figure 4E:
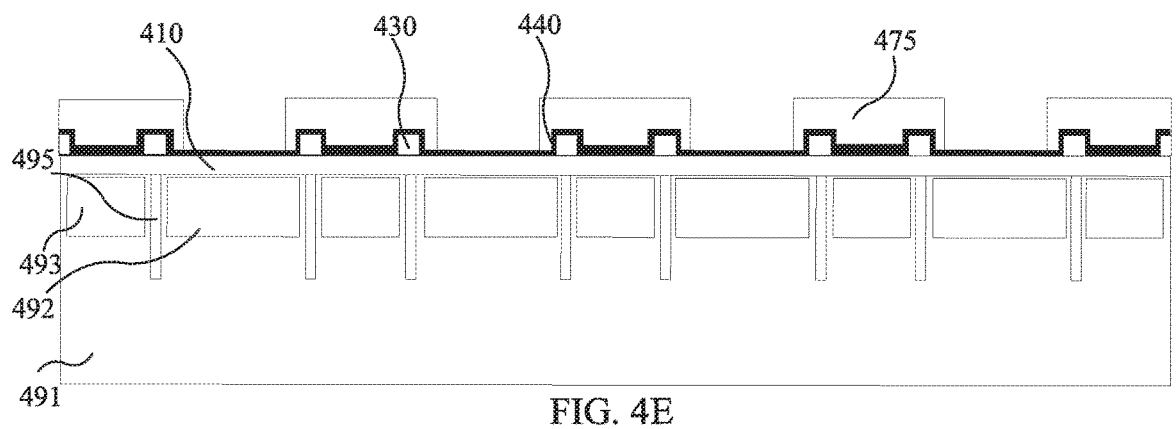

FIG. 4E illustrates the device of FIG. 4D with a mask 475 formed over and aligned with the small photodiodes 493 and extending from the respective metal pattern 430 over a portion of the large photodiodes 492. Restated, the mask 475 is formed covering the small photodiodes 493 and a portion of large photodiodes 492. The mask 475 may include a photoresist material.

Figure 4F:
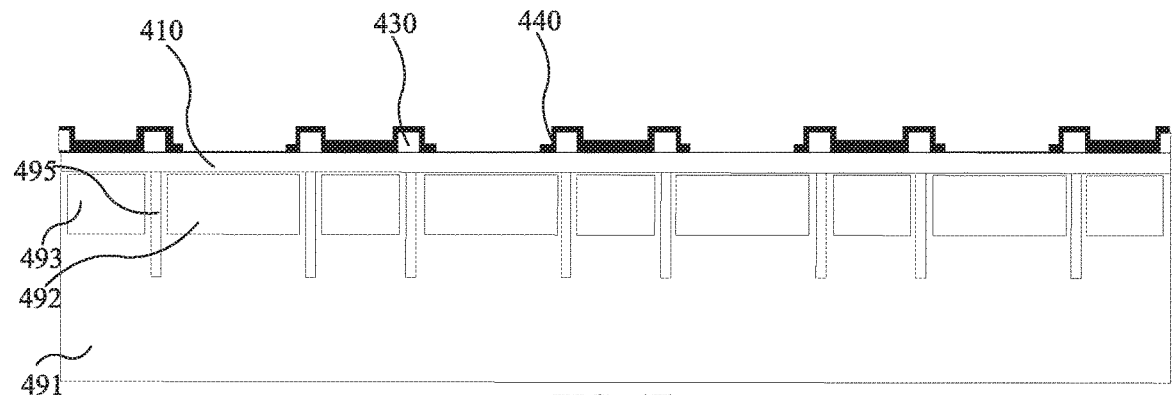

FIG. 4F illustrates the device of FIG. 4E with a portion of the attenuation layer 440 removed over the large photodiodes 492 and the mask also removed. The portion of the attenuation layer 440 over the large photodiodes 492 may be removed by etching away the attenuation layer 440 using the mask 475 as a mask. The mask 475 may be removed by a wet etching process. Color filters 250, 260 and microlenses 270, 280 may be formed on the device of FIG. 4F to arrive at the device of FIG. 2B.

Figure 5A:
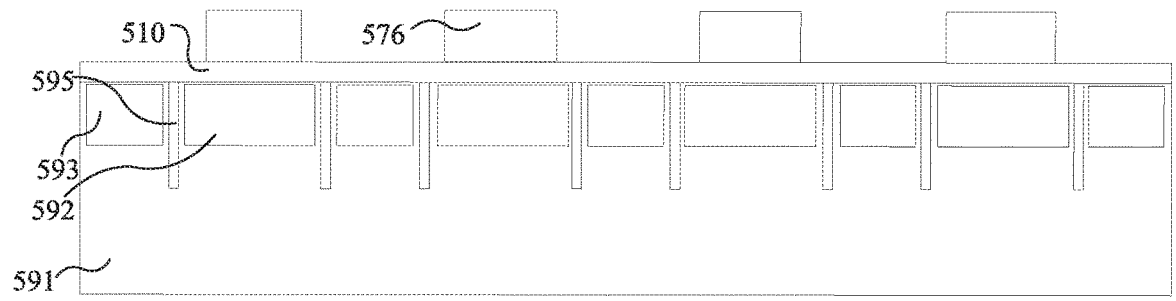
FIGS. 5A-D illustrate another example process of forming an image sensor in accordance with the teachings of the present invention.

FIGS. 5A-D illustrate another example process of forming an image sensor in accordance with the teachings of the present invention. FIG. 5A illustrates an example process of forming an image sensor in accordance with the teachings of the present invention. FIG. 5A illustrates a device including a substrate material 591, a plurality of pixel isolators 595, small photodiodes 593 and large photodiodes 592. The device also includes a buffer layer 510 formed on the substrate material 591. The device also includes a mask 576. The mask 576 is above and aligned with a portion of the large photodiodes 592.

Figure 5B:
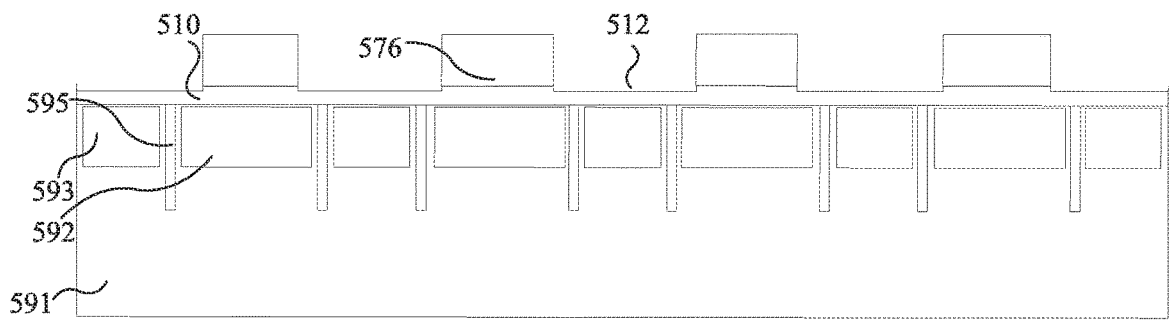

FIG. 5B illustrates the device of FIG. 5A with a portion removed from the buffer layer 510 forming a plurality of recesses 512, where the plurality of recesses 512 corresponding to the openings on the mask 576. The portion of the buffer layer 510 may be removed by patterning, for example by the mask 576 and anisotropic etching process.

Figure 5C:
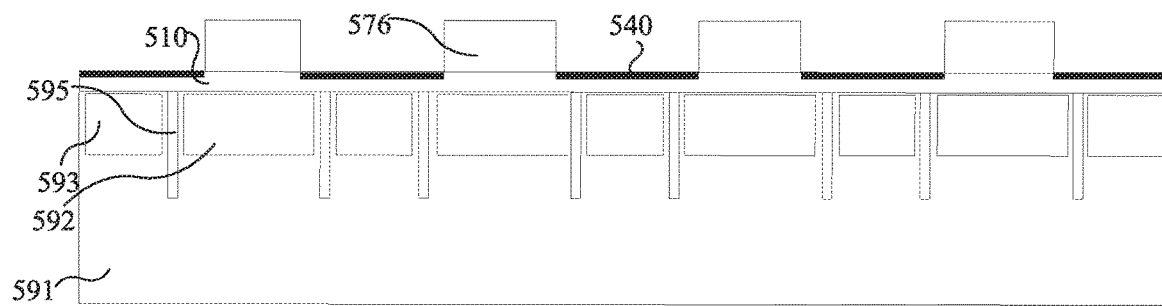

FIG. 5C illustrates the device of FIG. 5B with the plurality of recesses 512 filled in with an attenuation layer 540. The attenuation layer 540 may be deposited using an anisotropic deposition method, such as chemical vapor deposition (CVD), physical vapor deposition (PVD), or atomic layer deposition (ALD). The depth of each recess 512 may be configured based on the thickness of the attenuation layer 540.

Figure 5D:
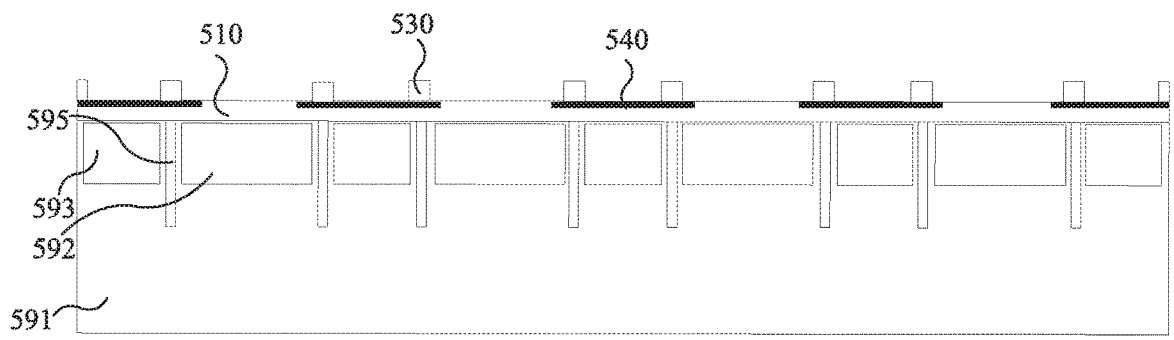

FIG. 5D illustrates the device of FIG. 5C with the mask 576 removed and a metal pattern 530 formed. The mask 576 may be removed by chemical mechanical planarization or by a wet etching method. Chemical mechanical planarization may be used to cause the top surface of the buffer layer 510 without the attenuation layer 540 over it and the top surface of the attenuation layer 540 to be leveled. A plurality of metal patterns 530 may be formed on the attenuation layer 540. Color filters 250, 260 and microlenses 270, 280 may be formed on the device of FIG. 5D to arrive at the device of FIG. 2C.

Figure 6A:
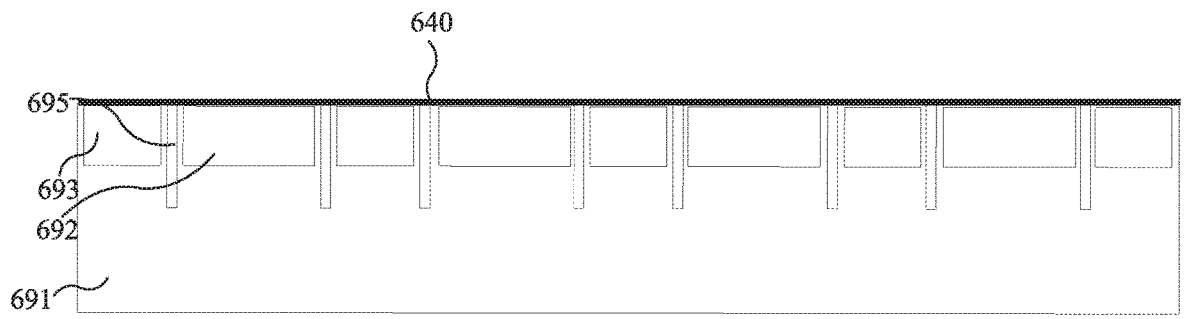
FIGS. 6A-D illustrate another example process of forming an image sensor in accordance with the teachings of the present invention.

FIGS. 6A-D illustrate another example process of forming an image sensor in accordance with the teachings of the present invention. FIG. 6A illustrates a device including a substrate material 691, a plurality of pixel isolators 695, small photodiodes 693, and large photodiodes 692. The device also includes an attenuation layer 640 formed on a backside surface of the substrate material 691. In one embodiment, a planarization layer formed of silicon dioxide may be formed between the attenuation layer 640 and the substrate material 691 to reduce surface tension stress.

Figure 6B:
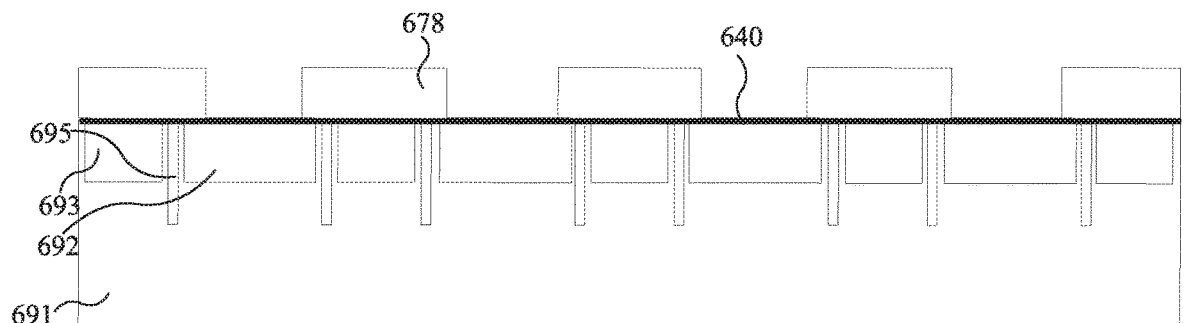
Figure 6C:
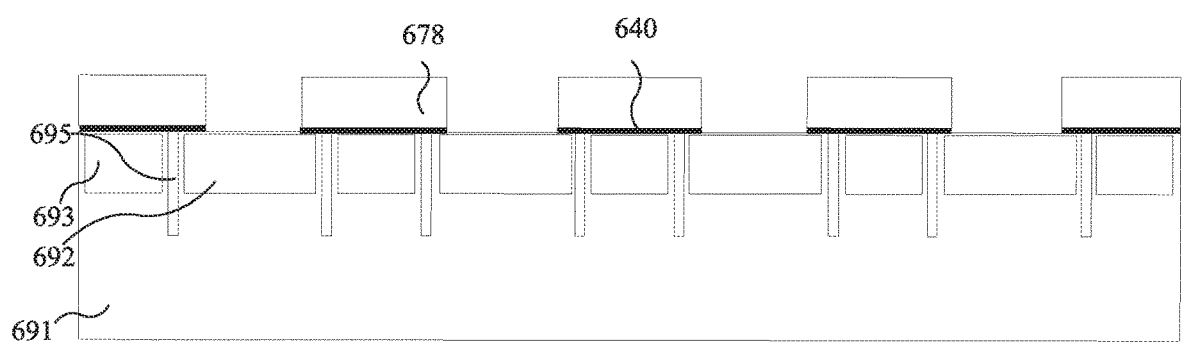

FIG. 6B illustrates the device of FIG. 6A with a mask 678 formed on the attenuation layer 640. The mask 678 may include a photoresist material. The mask may be above and aligned with the small photodiodes 693 and a portion of the large photodiodes 692. FIG. 6C illustrates the device of FIG. 6B with a portion of the attenuation layer 640 etched away using the mask 678. The remaining portion of the attenuation layer 640 is above and aligned with the small photodiodes 693 and a portion of the large photodiodes 692.

Figure 6D:
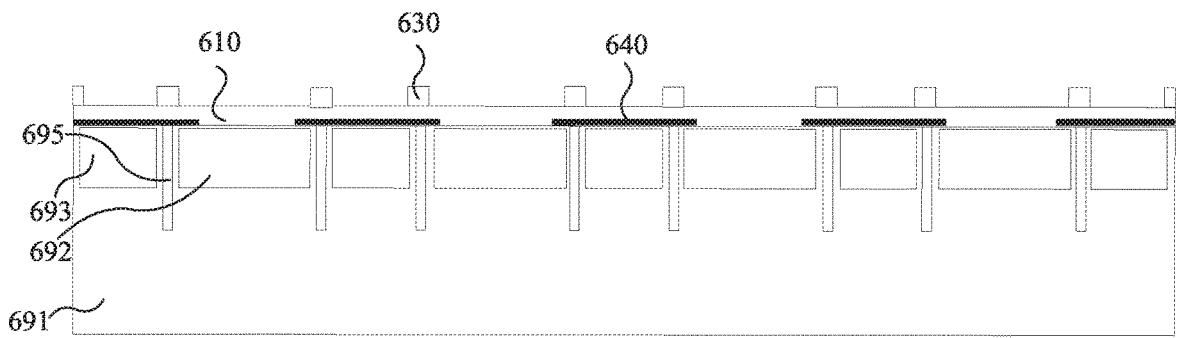

FIG. 6D illustrates the device of FIG. 6C with the mask 678 removed, and a buffer layer 610 and a plurality of metal patterns 630 formed. The mask 678 may be removed using a wet etching process. The buffer layer 610 may be formed on the substrate material 691 and the attenuation layer 640. The plurality of metal patterns 630 may be formed on the buffer layer 610. Color filters 250, 260 and microlenses 270, 280 may be formed on the device of FIG. 6D to arrive at the device of FIG. 2D.

Figure 7:
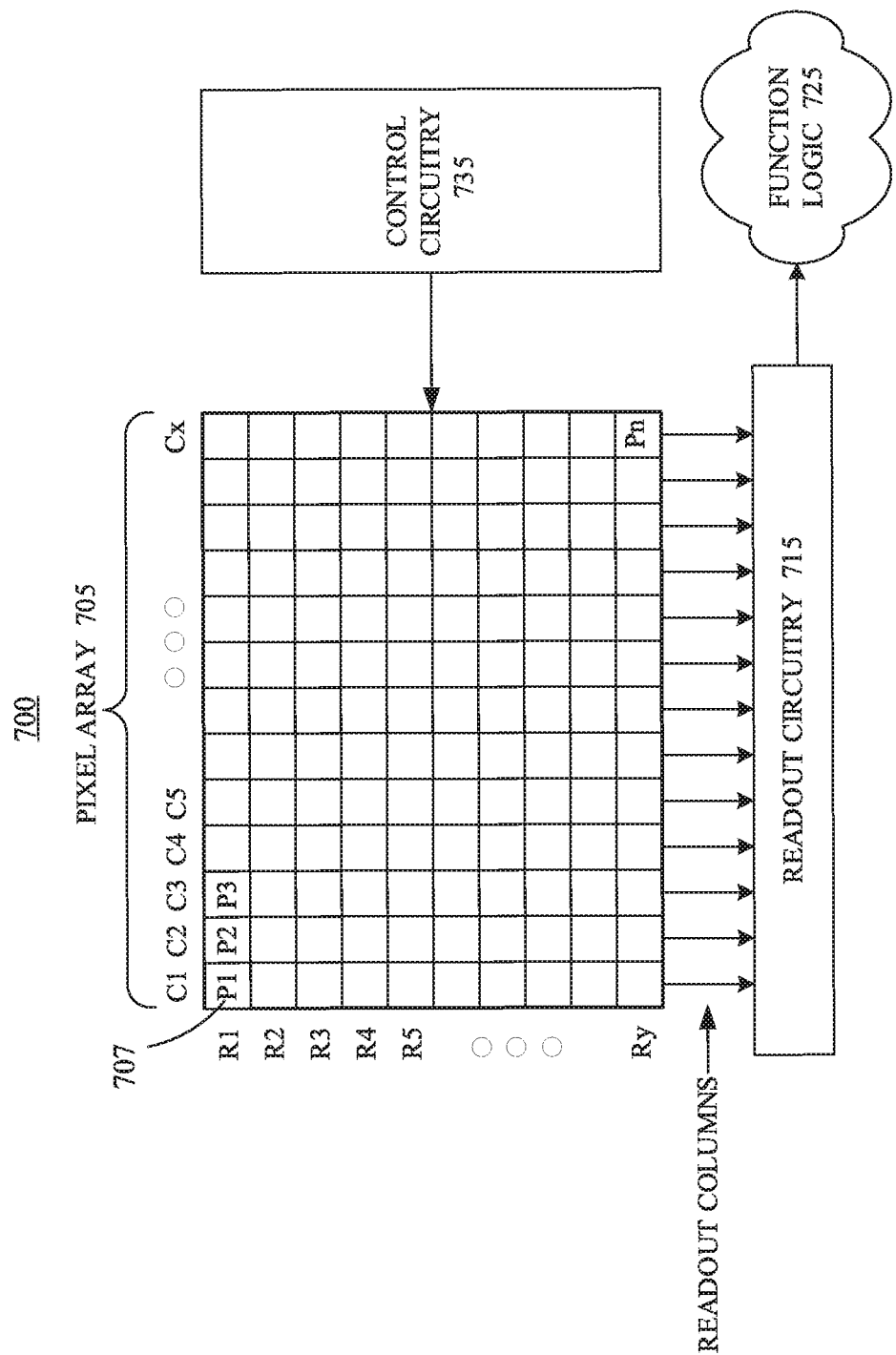
FIG. 7 is a diagram illustrating one example of an imaging system with a pixel array in accordance with the teachings of the present invention.

FIG. 7 is a diagram illustrating one example of an imaging system 700 with a pixel array 705 in accordance with the teachings of the present invention. As shown in the depicted example, an imaging system 700 includes a pixel array 705 coupled to a control circuitry 735 and a readout circuitry 715, which is coupled to a function logic 725.

Pixel array 705 is a two-dimensional ("2D") array of pixels 707 (e.g., pixels P1, P2 . . . , Pn). In one embodiment, each pixel is a complementary metal-oxide-semiconductor ("CMOS") imaging pixel. Pixel array 705 may be implemented as either a front side illuminated image sensor array, or a backside illuminated image sensor array. In one embodiment, pixel array 705 includes a pixel array, such as the pixel array depicted in FIGS. 1A-B and FIGS. 2A-D. The pixel array 705 includes a plurality of pixels 707. As illustrated, each pixel 707 is arranged into a row (e.g., rows R1 to Ry) and a column (e.g., column C1 to Cx) to acquire image data of a person, place, or object, which can then be used to render a 2D image of the person, place, or object.

In one embodiment, after each pixel 707 has acquired its image data or image charge, the image data is readout by readout circuitry 715 and transferred to function logic 725. Readout circuitry 715 may include amplification circuitry, e.g., a differential amplifier circuitry, analog-to-digital ("ADC") conversion circuitry, or otherwise.

Function logic 725 may include logic and memory for storing the image data or even manipulating the image data by applying post image effects (e.g., crop, rotate, remove red eye, adjust brightness, adjust contrast, or otherwise). In one example, the readout circuitry 715 may readout a row of image data at a time along readout column lines (illustrated) or may readout the image data using a variety of other techniques (not illustrated), such as a serial readout or a full parallel readout of all pixels simultaneously.

Control circuitry 735 is coupled to pixel array 705. Control circuitry 735 may include logic and memory for controlling operational characteristic of pixel array 705. For example, control circuitry 735 may generate a shutter signal for controlling image acquisition. In one embodiment, the shutter signal is a global shutter signal for simultaneously enabling all pixels 707 within pixel array 705 to simultaneously capture their respective image data during a single acquisition window. In an alternative embodiment, the shutter signal is a rolling shutter signal whereby each row, column, or group of pixels is sequentially enabled during consecutive acquisition windows.

Figure 8:
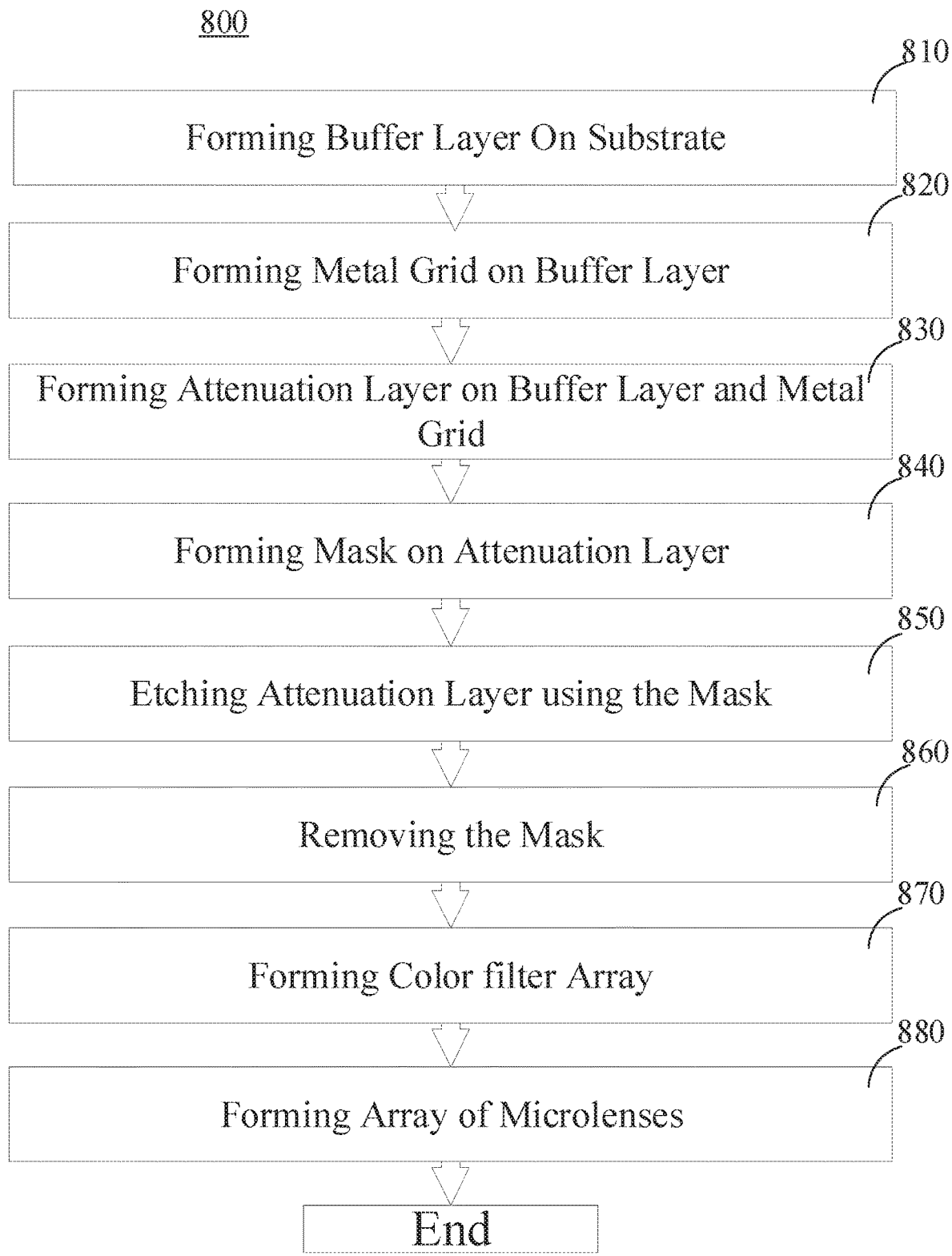
FIG. 8 illustrates an example flow diagram illustrating a process of forming an image sensor in accordance with the teachings of the present invention.

FIG. 8 illustrates an example flow diagram 800 illustrating a process of forming an image sensor with cross section illustrated in FIG. 2A in accordance with the teachings of the present invention. At block 810, a buffer layer 210 may be formed on a substrate material 291, where the substrate material includes a plurality of large and small photodiodes 292, 293 and a plurality of pixel isolators 295 disposed between adjacent photodiodes 292, 293 formed therein. The buffer layer 210 may be grown from the substrate material 291, for example by oxidation process or deposited on the substrate material 291, for example by chemical vapor deposition (CVD). At block 820, a plurality of metal patterns 230 may be formed on the buffer layer 210. The plurality of metal patterns 230 may be formed by depositing a metal layer over the buffer layer 210, then forming a mask pattern on the metal layer and using the mask pattern to etch the metal layer to form the plurality of metal patterns.

At block 830, an attenuation layer 242 is formed on the buffer layer 210 and the plurality of metal patterns 230, for example by a chemical vapor deposition (CVD) process. The attenuation layer 242 may be a single layer or multi-layer stack structure. In one example, the attenuation layer 242 may include a first layer 341 (e.g., Ti layer) and a second layer 343 (e.g., TiN layer). At block 840, a mask (for example mask 375 of FIG. 3B) may be patterned and formed on the attenuation layer 242. The mask (e.g., mask 375) may include a photoresist material. The mask (e.g., mask 375) may be formed by depositing the photoresist material as a layer over the device, then patterning the photoresist material to form the mask (e.g., mask 375) with openings corresponding to the region (e.g., light exposure area) above the large photodiodes. Each of openings may be patterned to be smaller than the size of light exposure area of the large photodiodes i.e., each of openings on the mask (e.g., mask 375) may be configured to be less than the spacing between two adjacent metal patterns 230 that formed above the corresponding pixel isolators 295 in between which a large photodiode is formed.

At block 850, the attenuation layer 242 may be etched using the mask (e.g., mask 375). The etched attenuation layer 242 may be above and aligned with the small photodiodes 293, arranged to extend from the edge of the respective metal patterns 230 covering a portion of the light exposure area of the large photodiodes 292. The attenuation layer 242 may be arranged to extend about 10-500 nm from the edge of the respective metal pattern 230 over to cover a portion of light exposure area associated with the large photodiodes. Restated, an edge of the attenuation layer 242 is over at least one of the large photodiodes 292 and may be 10-500 nm from the respective metal pattern 230 or a distance computed based on the required quantum efficiency for large photodiodes 292. As discussed with relation to FIGS. 1A-B the attenuation layer 242 may only extend from the portions of the plurality of metal patterns 130 between the large photodiodes 292 and small photodiodes 293 or may extend from all portions of the respective metal pattern 130.

At block 860, the mask (e.g., mask 375) may be removed. The mask may be removed using a wet etching process. At block 870, color filters 250, 260 may be formed on the attenuation layer 242 and buffer layer 210. The color filters 250, 260 may be formed by processes known in the art, such as by forming and etching each color of color filter 250, 260 one after another.

At block 880, an array of microlenses 270, 280 may be formed on the color filters 250, 260. Microlens 280 may be formed above and aligned with each of the small photodiodes 293, and microlens 270 may be formed above and aligned with large photodiodes 292. The microlenses 270 above the large photodiodes may have optical properties such that incident light arriving at an angle perpendicular to a top surface of the substrate will be focused on the large photodiode 292 without having an optical path that passes through the attenuation layer 242.

Figure 9:
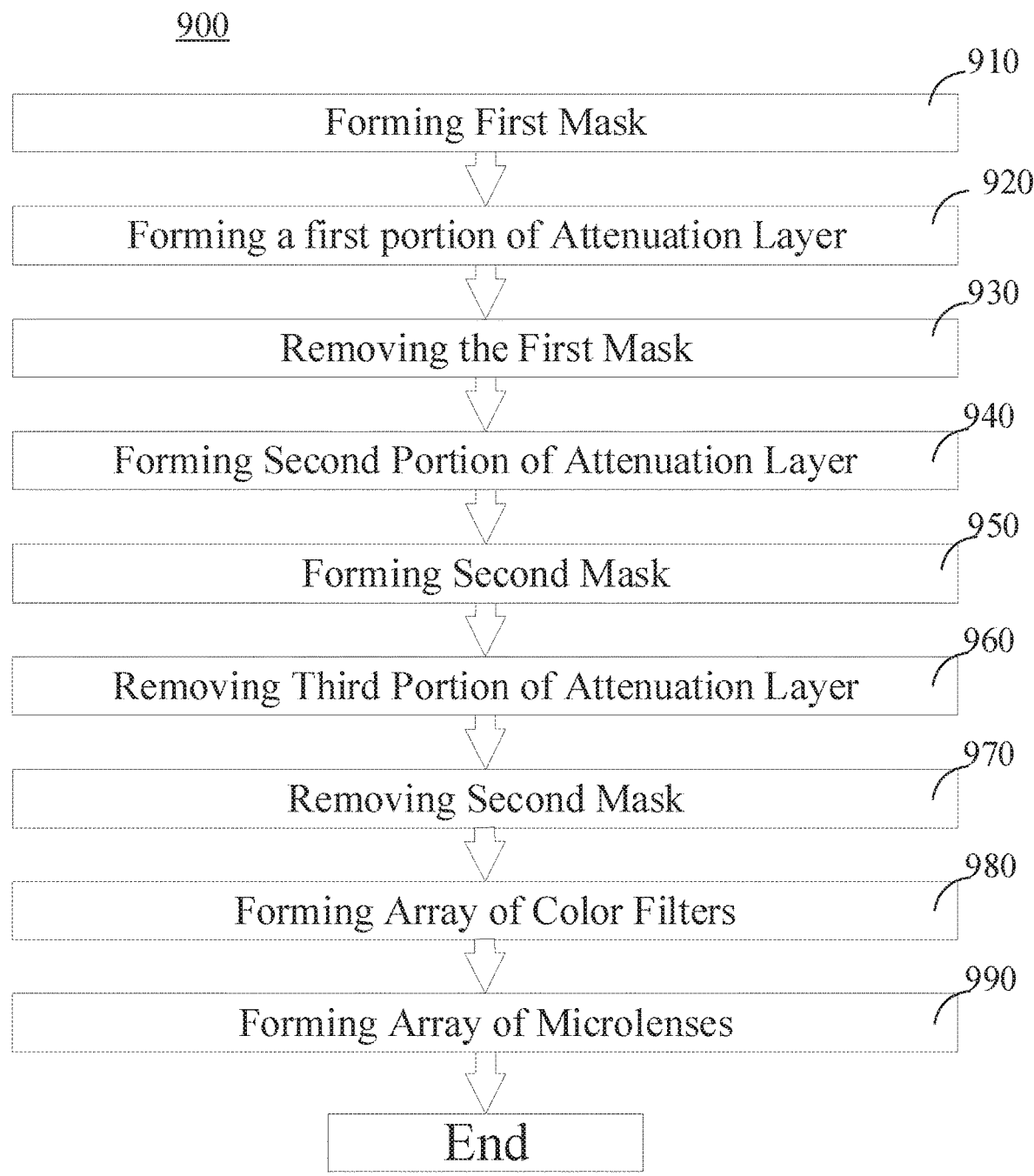
FIG. 9 illustrates another example flow diagram illustrating a process of forming an image sensor in accordance with the teachings of the present invention.

FIG. 9 illustrates another example flow diagram 900 illustrating a process of forming an image sensor having pixel structure illustrated in FIG. 2B in accordance with the teachings of the present invention. At block 910, a first mask (e.g., mask 474 of FIG. 4A) may be formed on the buffer layer 210. At block 920, a first portion of the attenuation layer 244 may be formed on the buffer layer 210 above and aligned with the small photodiodes 293. At block 930, the first mask (e.g., mask 474 of FIG. 4A) may be removed using a wet etching process.

At block 940, a second portion of the attenuation layer 244 may be formed over the first portion of attenuation layer 244. The second portion of the attenuation layer 244 may cover the buffer layer 210, metal pattern 230, and the first portion of the attenuation layer 244. At block 950, a second mask (e.g., mask 475 of FIG. 4E) may be formed on the attenuation layer 244. At block 960, a third portion of the attenuation layer 244 above to large photodiodes 292 may be removed by etching the attenuation layer 244 using the second mask (e.g., mask 475 of FIG. 4E). The remaining portion of the attenuation layer 244 may be above and aligned with the small photodiodes 293, the respective metal pattern 230, and a portion of the large photodiodes 292. The portion of the attenuation layer 244 above and aligned with the light exposure area of the small photodiodes 293 is thicker than the portion of the attenuation layer 244 covering the light exposure area of the large photodiodes 292. As discussed with relation to FIGS. 1A-B the attenuation layer 244 may only extend from the portions of the metal pattern 130 between the large photodiodes 292 and small photodiodes 293 or may extend from all portions of the metal pattern 130.

At block 970, the second mask (e.g., mask 475) may be removed using a wet etching process. At block 980, color filters 250, 260 may be formed on the attenuation layer 244 and buffer layer 210. At block 990, an array of microlenses 270, 280 may be formed on the color filters 250, 260.

Figure 10:
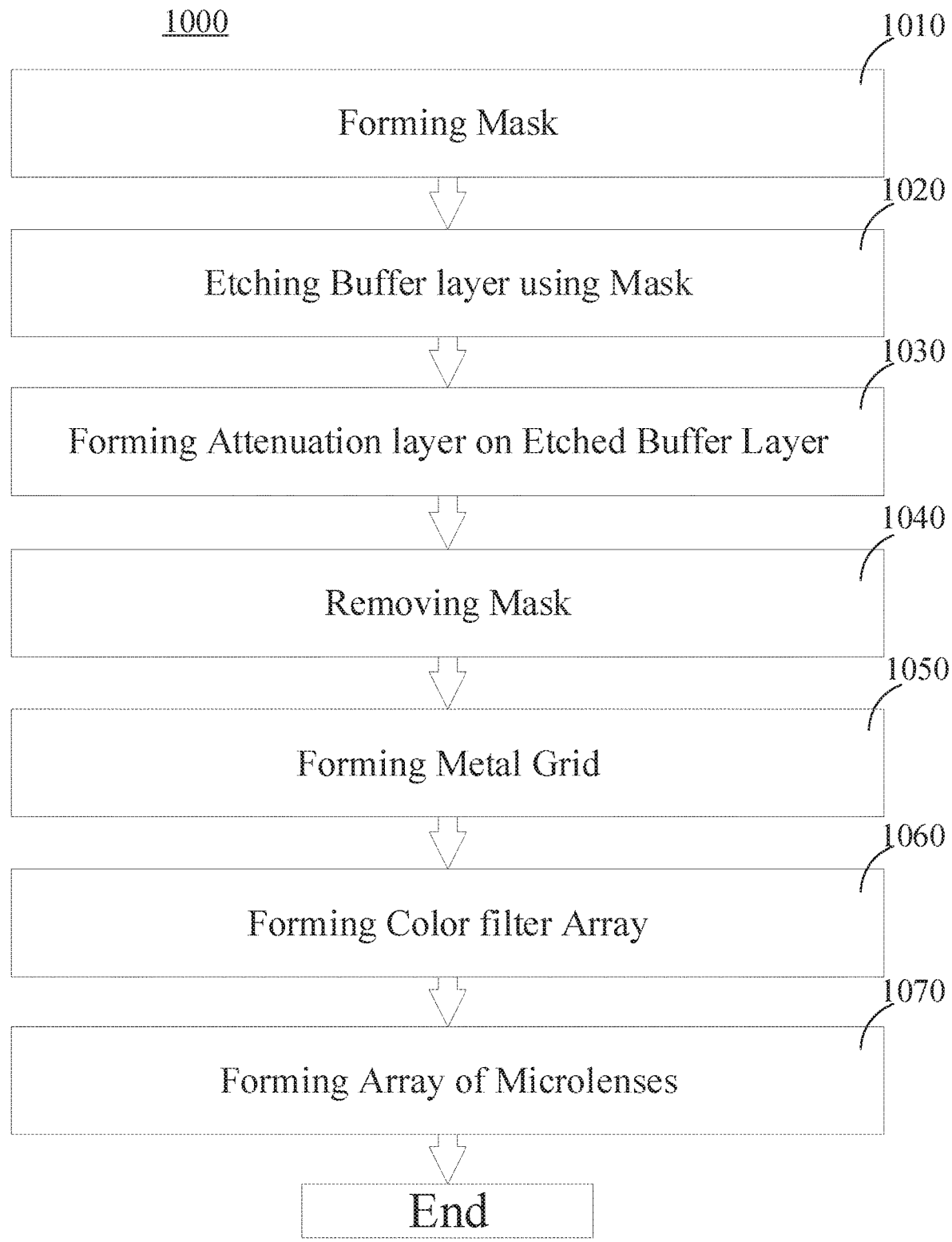
FIG. 10 illustrates another example flow diagram illustrating a process of forming an image sensor in accordance with the teachings of the present invention.

FIG. 10 illustrates another example flow diagram 1000 illustrating a process of forming an image sensor having pixel structure illustrated in FIG. 2C and FIG. 5A-D in accordance with the teachings of the present invention. At block 1010, a mask (e.g., mask 576) is formed on the buffer layer 210. At block 1020, the mask is used to etch the buffer layer 210 to form one or more recesses 512 in the buffer layer 210. The etching process may be an anisotropic etching process such as plasma etching. The buffer layer 210 may be etched about 50-150 nm.

At block 1030, the attenuation layer 246 is formed in the etched portion of the buffer layer 210, i.e. the attenuation layer 246 is formed in the recesses 512 in the buffer layer 210 by suitable deposition process. At block 1040, the mask (e.g., mask 576) is removed. The mask (e.g., mask 576) may be removed by chemical-mechanical planarization, and the attenuation layer 440 and buffer layer 210 may be leveled by the chemical-mechanical planarization process. Alternatively, the mask (e.g., mask 576) may be removed by a wet etching process.

At block 1050, a plurality of metal patterns 230 may be formed. As discussed with relation to FIGS. 1A-B the attenuation layer 246 may only extend from the portions of the metal pattern 130 between the large photodiodes 292 and small photodiodes 293 or may extend from all portions of the plurality of metal patterns 130. Accordingly, the metal plurality of patterns 230 may be formed only on the attenuation layer 246 or may be formed partially on the attenuation layer 246 and partially on the buffer layer 210.

At block 1060, color filters 250, 260 may be formed on the attenuation layer 246, metal pattern 230, and buffer layer 210. At block 1070, an array of microlenses 270, 280 may be formed on the color filters 250, 260.

Figure 11:
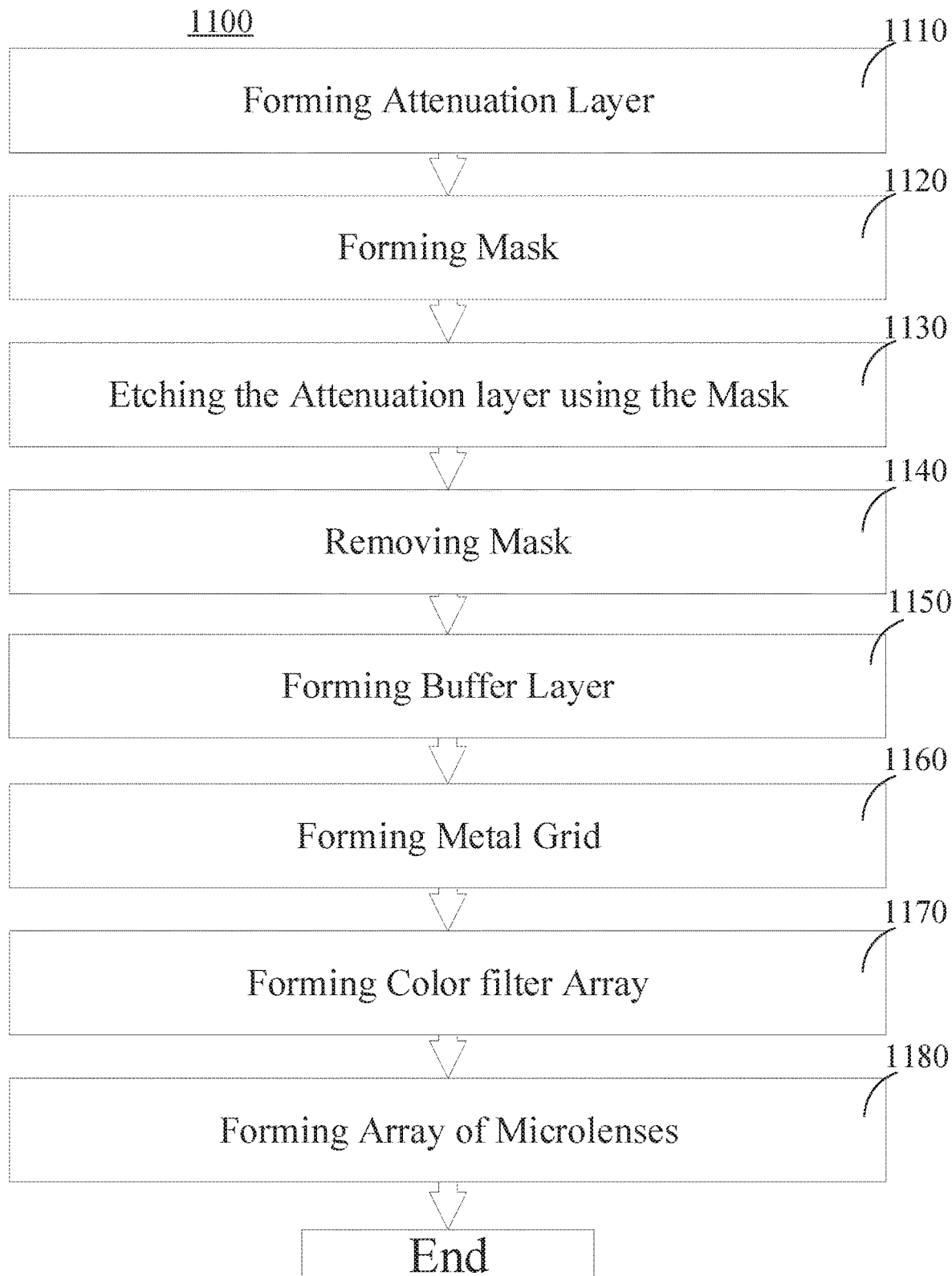
FIG. 11 illustrates another example flow diagram illustrating a process of forming an image sensor in accordance with the teachings of the present invention.

FIG. 11 illustrates another example flow diagram 1100 illustrating a process of forming an image sensor having pixel structure illustrated in FIG. 2D in accordance with the teachings of the present invention. At block 1110, the attenuation layer 248 may be formed on a backside surface of the substrate material 291 by deposition technique such as chemical vapor deposition (CVD), physical vapor deposition (PVD), or atomic layer deposition (ALD). The attenuation layer 248 may formed as a layer over the substrate material 291. At block 1120, a mask 678 may be formed on the attenuation layer. At block 1130, the mask 678 may be patterned and used to etch the attenuation layer 248 to remove a portion of the attenuation layer 248 above and aligned with the large photodiodes 292. At block 1140, the mask 678 may be removed.

At block 1150 the buffer layer 210 may be formed over the attenuation layer 248 and substrate material 291. At block 1160, a plurality of metal patterns 230 may be formed on the buffer layer 210. At block 1170, color filters 250, 260 may be formed on the buffer layer 210 and metal pattern 230. At block 1180, an array of microlenses 270, 280 may be formed on the color filters 250, 260.

As can be appreciated by the above description of the image sensor with split pixel structures and methods of manufacturing the same, the disclosure provides for an image sensor with improved performance with regards to high intensity light sensing.

The above description of illustrated examples of the present invention, including what stop is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An image sensor, comprising:
   a substrate material including a plurality of photodiodes disposed therein, wherein the plurality of photodiodes includes a plurality of small photodiodes (SPDs) and a plurality of large photodiodes (LPDs), and wherein each of the plurality of LPDs has a first full well capacity larger than a second full well capacity of each of the plurality of SPDs;
   an array of color filters disposed proximate to the plurality of photodiodes included in the substrate material;
   a plurality of metal patterns disposed proximate to the plurality of photodiodes, wherein individual metal patterns included in the plurality of metal patterns are disposed between adjacent color filters included in the array of color filters; and
   an attenuation layer disposed between the plurality of SPDs and the array of color filters to attenuate light propagating through the attenuation layer that is incident upon the plurality of SPDs, wherein the attenuation layer is further disposed, at least in part, between the plurality of LPDs and the array of color filters such that the attenuation layer includes an extended portion disposed between a color filter included in the array of color filters and a corresponding one of the plurality of LPDs optically aligned with the color filter.

2. The image sensor of claim 1, further comprising:
   a buffer layer disposed between the substrate material and the array of color filters, and wherein the attenuation layer is disposed between the substrate material and the buffer layer.

3. The image sensor of claim 1, further comprising a buffer layer disposed between the substrate material and the array of color filters, and wherein the attenuation layer is disposed between the buffer layer and the array of color filters.

4. The image sensor of claim 3, wherein the attenuation layer is disposed between the buffer layer and the plurality of metal patterns such that the attenuation layer directly contacts the plurality of metal patterns.

5. The image sensor of claim 3, wherein the attenuation layer is disposed between the plurality of metal patterns and the array of color filters such that the attenuation layer directly contacts the plurality of metal patterns.

6. The image sensor of claim 1, wherein an edge of the attenuation layer is disposed between a first LPD included in the plurality of LPDs and a first color filter included in the array of color filters, wherein an extended distance of the attenuation layer corresponds to a lateral length from an edge of an adjacent metal pattern included in the plurality of metal patterns to the edge of the attenuation layer, and wherein the extended distance ranges from 10 nm to 500 nm.

7. The image sensor of claim 1, wherein a first portion of the attenuation layer disposed between a first SPD included in the plurality of SPDs and the array of color filters is thicker than a second portion of the attenuation layer disposed between a first LPD included in the plurality of LPDs and the array of color filters, and wherein the first SPD is adjacent to the first LPD.

8. The image sensor of claim 1, wherein the attenuation layer is formed of stacked layers including a metal layer and a metal nitride layer.

9. The image sensor of claim 1, further comprising an array of microlenses optically aligned with the plurality of photodiodes, wherein the array of color filters is disposed between the array of microlenses and the plurality of photodiodes, and wherein the attenuation layer is structured such that incident light perpendicular to a surface of the substrate material reaches the plurality of LPDs without passing through the attenuation layer when the incident light is directed by individual microlenses included in the array of microlenses that are optically aligned with the plurality of LPDs.

10. The image sensor of claim 1, wherein the attenuation layer extends laterally in a plane parallel to a top surface of the substrate material.

11. The image sensor of claim 1, wherein the attenuation layer is positioned to influence a quantum efficiency of each of the plurality of LPDs based on an extent the attenuation layer is disposed between the plurality of LPDs and the array of color filters, and wherein the quantum efficiency is between 0.4 to 0.9 for incident light with a wavelength of 530 nm.

12. A method of manufacturing an image sensor, comprising:
    forming a buffer layer on a substrate material, wherein the substrate material includes a plurality of photodiodes, and wherein the plurality of photodiodes includes a plurality of large photodiodes (LPDs) with a first full well capacity and a plurality of small photodiodes (SPDs) with a second full well capacity, and wherein the first full well capacity is larger than the second full well capacity;
    forming a plurality of metal patterns disposed proximate to the plurality of photodiodes;
    forming an attenuation layer to attenuate light propagating through the attenuation layer this is incident upon the plurality of SPDs; and
    forming an array of color filters proximate to the plurality of photodiodes included in the substrate material, wherein individual metal patterns included in the plurality of metal patterns are disposed between adjacent color filters included in the array of color filters, wherein the attenuation layer is disposed between the plurality of SPDs and the array of color filters, and wherein the attenuation is further disposed, at least in part, between the plurality of LPDs and the array of color filters such that the attenuation layer includes an extended portion disposed between a color filter included in the array of color filters and a corresponding one of the plurality of LPDs optically aligned with the color filter.

13. The method of claim 12, wherein forming the attenuation layer includes forming a mask and etching away a portion of the attenuation layer over each of the plurality of LPDs using the mask such that an edge of the attenuation layer is disposed between a first LPD included in the plurality of LPDs and a first color filter included in the array of color filters.

14. The method of claim 12 further comprising: forming an array of microlenses optically aligned with the plurality of photodiodes, wherein the array of color filters is disposed between the array of microlenses and the plurality of photodiodes, and wherein the attenuation layer is structured such that incident light perpendicular to a surface of the substrate material reaches the plurality of LPDs without passing through the attenuation layer when the incident light is directed by individual microlenses included in the array of microlenses that are optically aligned with the plurality of LPDs.

15. The method of claim 12, wherein the attenuation layer is formed between the substrate material and the buffer layer.

16. The method of claim 12, wherein the attenuation layer is formed between the buffer layer and the array of color filters.

17. The method of claim 16, wherein the attenuation layer is formed between the buffer layer and the plurality of metal patterns such that the attenuation layer directly contacts the plurality of metal patterns.

18. The method of claim 16, wherein the attenuation layer is formed between the plurality of metal patterns and the array of color filters such that the attenuation layer directly contacts the plurality of metal patterns.

19. The method of claim 12, further comprising, removing a portion of the attenuation layer such that an edge of the attenuation layer is disposed between a first LPD included in the plurality of LPDs and a first color filter included in the plurality of color filters, wherein an extended distance of the attenuation layer corresponds to a lateral length from an edge of an adjacent metal pattern included in the plurality of metal patterns to the edge of the attenuation layer, and wherein the extended distance ranges from 10 nm to 500 nm.

20. The method of claim 19, wherein the attenuation layer extends laterally in a plane parallel to a top surface of the substrate material.

21. The method of claim 12, wherein a first portion of the attenuation layer disposed between a first SPD included in the plurality of SPDs and the array of color filters is thicker than a second portion of the attenuation layer disposed between a first LPD included in the plurality of LPDs and the array of color filters, and wherein the first SPD is adjacent to the first LPD.

22. The method of claim 12, wherein the attenuation layer is formed to influence a quantum efficiency of each of the plurality of LPDs based on an extent the attenuation layer is disposed between the plurality of LPDs and the array of color filters, and wherein the quantum efficiency is between 0.4 to 0.9 for incident light with a wavelength of 530 nm.

23. The image sensor of claim 1, wherein the attenuation layer is structured to entirely cover the plurality of SPDs and only partially cover the plurality of LPDs.

24. The image sensor of claim 1, wherein the attenuation layer is structured to form a plurality of apertures, each individual aperture included in the plurality of apertures aligned with a corresponding one of the plurality of LPDs.

25. The image sensor of claim 1, wherein the attenuation layer is structured to extend laterally from between the plurality of SPDs and the array of filters to overlap with adjacent LPDs included in the plurality of LPDs.

26. The image sensor of claim 8, wherein the metal layer corresponds to a layer of titanium and the metal nitride layer corresponds to a titanium nitride layer.

* * * * *